US008860033B2

(12) United States Patent
Kita et al.

(10) Patent No.: US 8,860,033 B2
(45) Date of Patent: Oct. 14, 2014

(54) ACTIVE MATRIX SUBSTRATE

(75) Inventors: Makoto Kita, Osaka (JP); Mutsumi Nakajima, Osaka (JP); Yoshimizu Moriya, Osaka (JP); Yasuyoshi Kaise, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1024 days.

(21) Appl. No.: 12/531,383

(22) PCT Filed: Feb. 29, 2008

(86) PCT No.: PCT/JP2008/053689
§ 371 (c)(1),
(2), (4) Date: Sep. 15, 2009

(87) PCT Pub. No.: WO2008/114598
PCT Pub. Date: Sep. 25, 2008

(65) Prior Publication Data
US 2010/0096639 A1    Apr. 22, 2010

(30) Foreign Application Priority Data

Mar. 16, 2007   (JP) ................................ 2007-069140

(51) Int. Cl.
| H01L 29/04 | (2006.01) |
| G02F 1/1368 | (2006.01) |
| H01L 27/12 | (2006.01) |
| H01L 29/786 | (2006.01) |
| G02F 1/1362 | (2006.01) |

(52) U.S. Cl.
CPC .......... *H01L 27/12* (2013.01); *H01L 29/78645* (2013.01); *G02F 1/1368* (2013.01); *G02F 1/13624* (2013.01); *H01L 29/78696* (2013.01); *H01L 27/1214* (2013.01)
USPC ................ 257/72; 257/52; 257/59

(58) Field of Classification Search
USPC .......... 257/40, 52, 59, 72, E29.003, E29.273
See application file for complete search history.

(56) References Cited

U.S. PATENT DOCUMENTS

| 6,251,712 | B1 | 6/2001 | Tanaka et al. |
| 7,148,093 | B2 | 12/2006 | Makita |
| 2001/0025992 | A1 | 10/2001 | Nakajima et al. |
| 2003/0201442 | A1 | 10/2003 | Makita |
| 2010/0044710 | A1 | 2/2010 | Moriya et al. |

FOREIGN PATENT DOCUMENTS

| JP | 2003-303831 | 10/2003 |
| JP | 2006-128469 | 5/2006 |

OTHER PUBLICATIONS

U.S. Office Action mailed Oct. 24, 2011 in U.S. Appl. No. 12/531,406.
English translation of the International Preliminary Report on Patentability mailed Oct. 1, 2009 in corresponding PCT application PCT/JP2008/053689.
International Search Report for PCT/JP2008/053689, mailed May 13, 2008.

*Primary Examiner* — Ori Nadav
(74) *Attorney, Agent, or Firm* — Nixon & Vanderhye P.C.

(57) ABSTRACT

The active-matrix substrate (100) of the present invention satisfies $d_2 > d_1$ and $d_2 + A_1/2 > d_3 + L_1/2$, where $d_1$ is the length of the shortest line segment that connects together a channel region (134) and a gettering region (112) as measured by projecting the line segment onto a line that connects together the channel region (134) of a TFT (130) and a source contact portion, $d_2$ is the distance from the channel region (134) to the source contact portion (132c), $d_3$ is the distance from the channel region (134) to a first end portion (110a), $L_1$ is the length of the first end portion (110a), and $A_1$ is the length of the source contact portion (132c).

16 Claims, 9 Drawing Sheets

FIG.4
(a)
(b)
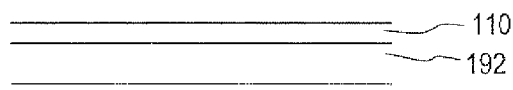
(c)
(d)
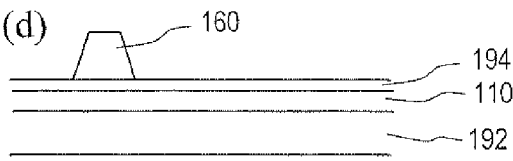
(e)
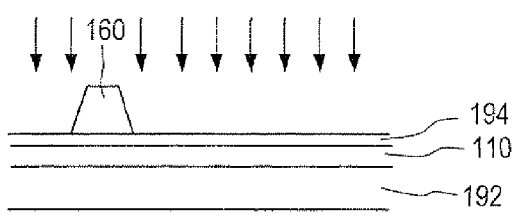
(f)
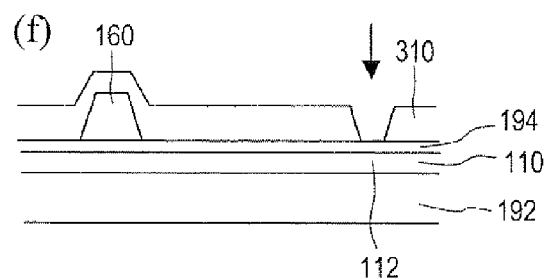
(g)
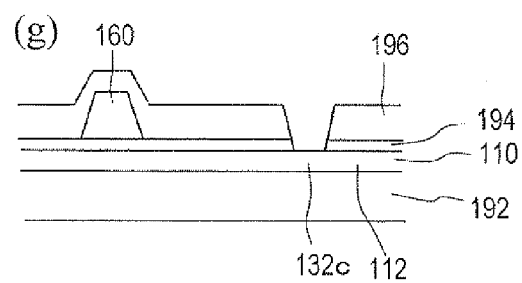
(h)
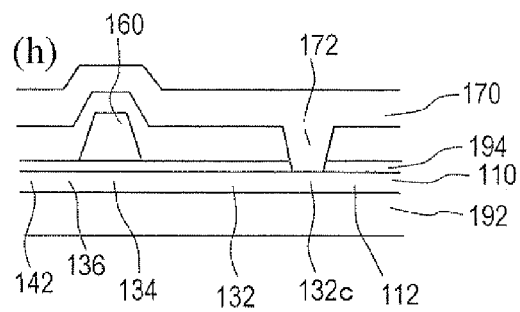

FIG. 7
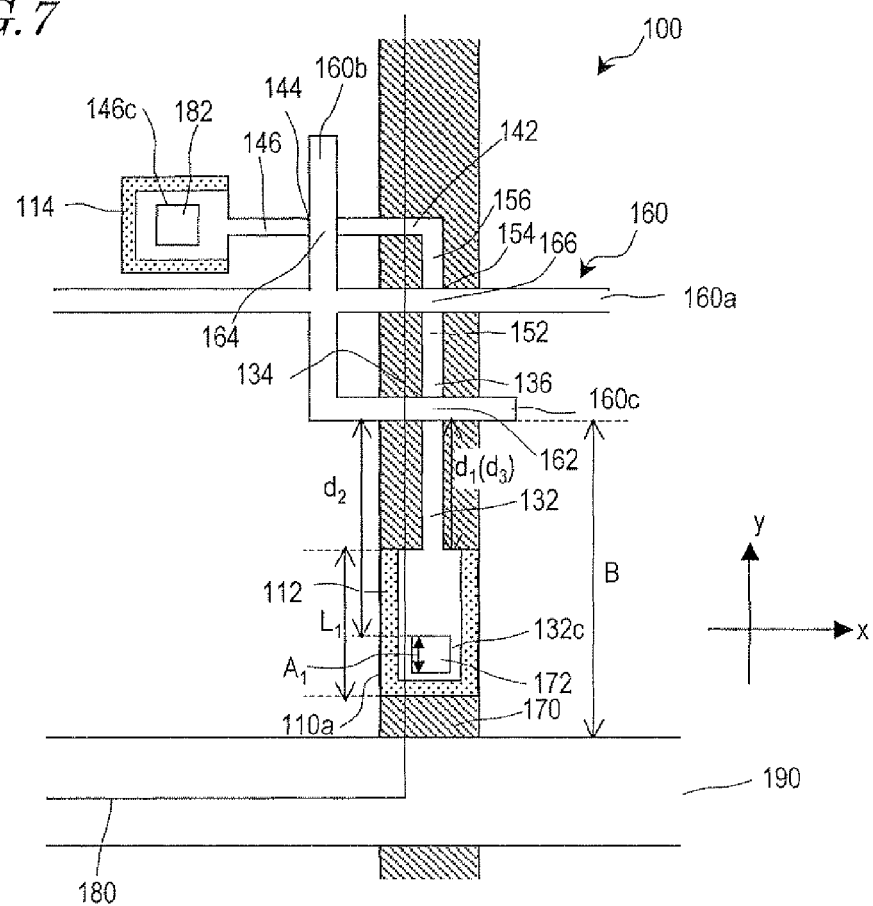
(a)
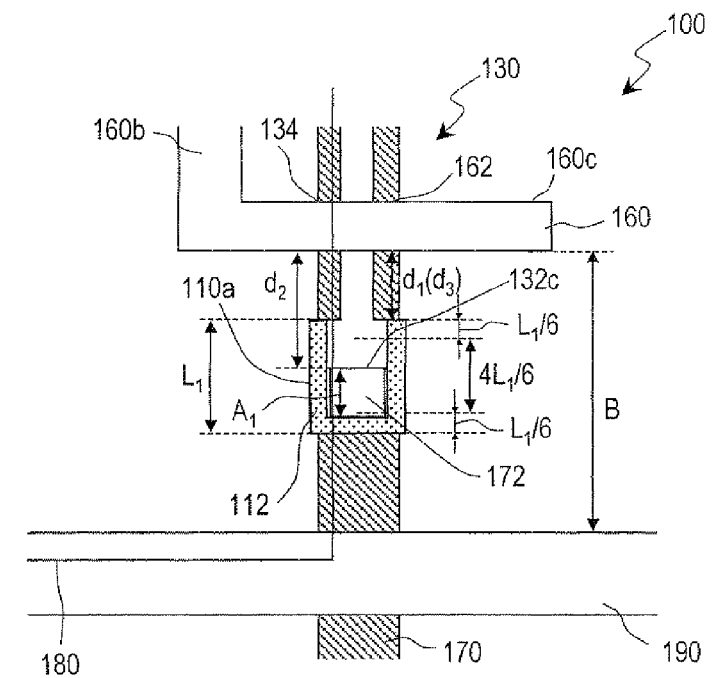
(b)

US 8,860,033 B2

ACTIVE MATRIX SUBSTRATE

This application is the U.S. national phase of International Application No. PCT/JP2008/053689, filed 29 Feb. 2008, which designated the U.S. and claims priority to Japanese Patent Application No. 2007-069140, filed 16 Mar. 2007, the entire contents of each of which are hereby incorporated by reference.

TECHNICAL FIELD

The present invention relates to an active-matrix substrate for use in a liquid crystal display device and other devices.

BACKGROUND ART

Recently, techniques for forming a semiconductor layer with a crystal structure (which will be referred to herein as a "crystalline semiconductor layer") by crystallizing an amorphous semiconductor layer that has been deposited on an insulating substrate such as a glass substrate have been researched extensively. Examples of such crystalline semiconductor layers include polycrystalline semiconductor layers and microcrystalline semiconductor layers. A thin-film transistor (TFT) that has been fabricated with a crystalline semiconductor layer has far higher carrier mobility than a TFT that has been fabricated with an amorphous semiconductor layer. For that reason, pixel TFTs for the display area on an active-matrix substrate with a built-in driver, which can be used effectively in a display device (such as a liquid crystal display device), and driver TFTs for the peripheral area thereof are fabricated using a crystalline semiconductor layer.

As a technique for crystallizing an amorphous semiconductor layer, a continuous grain silicon (CGS) process, in which the amorphous semiconductor layer is heated with a catalyst element (such as nickel) added thereto, is known. According to such a technique, a crystalline semiconductor layer of good quality with aligned crystallographic plane orientations can be obtained in a short time and at a low temperature. However, in a situation where a crystalline semiconductor layer has been formed by the CGS process, if the catalyst element remains in the channel region, then the OFF-state current of TFTs might increase suddenly. To suppress such a sudden increase in OFF-state current, a countermeasure for providing a gettering region to remove the catalyst element by a gettering process is known (see Patent Document No. 1, for example).

FIG. 13 illustrates a semiconductor device 800 as disclosed in Patent Document No. 1. The crystalline semiconductor layer 810 of the semiconductor device 800 has gettering regions 812 and 814 at the ends. Specifically, the gettering region 812 is arranged adjacent to a source region 832 so as to secure an electrical charge path leading from the source region 832 to a channel region 834. The source region 832 contacts with a source electrode 872 at source contact portions 832c, which are arranged around its center. Likewise, the gettering region 814 is arranged adjacent to a drain region 836 so as to secure an electrical charge path leading from the channel region 834 to the drain region 836. The drain region 836 contacts with a drain electrode 882 at drain contact portions 836c, which are arranged around its center. A Group V element such as phosphorus has been introduced into the gettering regions 812 and 814. By moving (i.e., gettering) a catalyst element remaining in the channel region 834 by heating it, the sudden increase in the OFF-state current of TFTs is suppressed.

Patent Document No. 1: Japanese Patent Application Laid-Open Publication No. 2006-128469

DISCLOSURE OF INVENTION

Problems to be Solved by the Invention

However, even in a situation where the gettering regions are arranged as in the semiconductor device disclosed in Patent Document No. 1, if the catalyst element has not been removed sufficiently from the channel region by the gettering region process, then the OFF-state current of TFTs could still increase suddenly.

Also, while TFTs having a gate-drain overlapped lightly doped drain (GOLDD) structure with good long-term reliability are used effectively as driver TFTs for an active-matrix substrate, TFTs having a lightly doped drain (LDD) structure that can reduce OFF-state current and can stabilize the breakdown voltage are used effectively as pixel TFTs. In a TFT with the LDD structure, a lightly doped region is arranged in its semiconductor layer so as not to overlap with the gate electrode. That is why the distance between a region of the semiconductor layer that overlaps with the gate electrode (i.e., channel region) and the gettering region is longer in a pixel TFT in the display area than in a driver TFT in the peripheral area. As a result, the gettering process often cannot get done completely in the pixel TFT. If the OFF-state current increased suddenly in a pixel TFT, then a point defect would be produced in the display device. For example, if the display device is a normally black mode liquid crystal display device, a point that is slightly darker than surrounding pixels is produced when a half scale tone is displayed (i.e., when a potential difference is recognizable most easily). On the other hand, if the display device is a normally white mode liquid crystal display device, a point that is slightly brighter than the surrounding pixels is produced.

To suppress such a sudden increase in the OFF-state current of a TFT, the gettering region could be arranged closer to the channel region so that the gettering performance improves. However, the present inventors discovered that just by shortening the distance between the gettering region and the channel region, leakage current was generated between a gate bus line and a source bus line to produce a line defect on the display device.

It is therefore an object of the present invention to provide an active-matrix substrate that can suppress not only such a sudden increase in the OFF-state current of a TFT but also the generation of leakage current between a gate bus line and a source bus line.

Means for Solving the Problems

An active-matrix substrate according to the present invention includes: a semiconductor layer; a thin-film transistor element including a first thin-film transistor, which has a source region, a channel region and a drain region that are included in the semiconductor layer; a gate bus line; a source bus line; and a pixel electrode. The source region of the first thin-film transistor includes a source contact portion. The semiconductor layer has a first gettering region adjacent to the source region of the first thin-film transistor. The semiconductor layer has a first end portion, a second end portion and an intermediate portion between the first and second end portions. The first end portion has a greater width than the intermediate portion. A part of the source region of the first thin-film transistor, including the source contact portion, and the first gettering region are located in the first end portion.

The first gettering region is located in an outer periphery of the first end portion except an electrical charge path leading from the source contact portion to the channel region of the first thin-film transistor. The active-matrix substrate satisfies $d_2>d_1\geq d_3$ and $d_2+A_1/2>d_3+L_1/2$, where $d_1$ is the length of the shortest line segment that connects together the channel region of the first thin-film transistor and the first gettering region as measured by projecting the line segment onto a line that connects together the channel region of the first thin-film transistor and the source contact portion, $d_2$ is the distance from the channel region of the first thin-film transistor to the source contact portion in the semiconductor layer, $d_3$ is the distance from the channel region of the first thin-film transistor to the first end portion of the semiconductor layer, $L_1$ is the length of the first end portion as measured along a line that connects together the channel region of the first thin-film transistor and the source contact portion, and $A_1$ is the length of the source contact portion as measured along the line that connects together the channel region of the first thin-film transistor and the source contact portion.

In one preferred embodiment, the active-matrix substrate satisfies $d_2-d_1>L_1/6$.

In one preferred embodiment, the active-matrix substrate satisfies $L_1>1.5\times A_1$.

In one preferred embodiment, $d_1$ and $d_2$ satisfy 3 $\mu m \leq d_1 \leq 13$ $\mu m$ and 8 $\mu m \leq d_2 \leq 30$ $\mu m$, respectively.

In one preferred embodiment, at least a part of the intermediate portion runs parallel to, and overlaps with, the source bus line.

In one preferred embodiment, at least a part of the first end portion overlaps with the source bus line.

In one preferred embodiment, the active-matrix substrate further includes a storage capacitor line, and satisfies $B\geq 2d_2+A_1$, where B is the distance between the gate bus line and the storage capacitor line.

In one preferred embodiment, the thin-film transistor element further includes a second thin-film transistor, which also has a source region, a channel region and a drain region that are included in the semiconductor layer. The first and second thin-film transistors are arranged in series with each other and the first thin-film transistor is located at one end, while the second thin-film transistor is located at the other end. And the drain region of the second thin-film transistor includes a drain contact portion.

In one preferred embodiment, the semiconductor layer has a second gettering region adjacent to the drain region of the second thin-film transistor.

In one preferred embodiment, the second end portion has a greater width than the intermediate portion. A part of the drain region of the second thin-film transistor, including the drain contact portion, and the second gettering region are located in the second end portion. The second gettering region is located in an outer periphery of the second end portion except an electrical charge path leading from the channel region of the second thin-film transistor to the drain contact portion. The active-matrix substrate satisfies $d_5>d_4\geq d_6$ and $d_5+A_2/2>d_6+L_2/2$, where $d_4$ is the length of the shortest line segment that connects together the channel region of the second thin-film transistor and the second gettering region as measured by projecting the line segment onto a line that connects together the channel region of the second thin-film transistor and the drain contact portion, $d_5$ is the distance from the channel region of the second thin-film transistor to the drain contact portion in the semiconductor layer, $d_6$ is the distance from the channel region of the second thin-film transistor to the second end portion of the semiconductor layer, $L_2$ is the length of the second end portion as measured along a line that connects together the channel region of the second thin-film transistor and the drain contact portion, and $A_2$ is the length of the drain contact portion as measured along the line that connects together the channel region of the second thin-film transistor and the drain contact portion.

In one preferred embodiment, $d_4$ and $d_5$ satisfy 3 $\mu m \leq d_4 \leq 13$ $\mu m$ and 8 $\mu m \leq d_5 \leq 30$ $\mu m$, respectively.

In one preferred embodiment, a part of the source region and the drain region of the first thin-film transistor, a part of the drain region and the source region of the second thin-film transistor, and the respective channel regions of the first and second thin-film transistors are located in the intermediate portion.

In one preferred embodiment, the active matrix substrate further includes an adjacent source bus line next to the source bus line, and satisfies $d_5<C-A_2$, where C is the distance between the gate bus line and the adjacent source bus line that are associated with the channel region of the second thin-film transistor.

In one preferred embodiment, the drain region of the first thin-film transistor includes a drain contact portion. The semiconductor layer has a second gettering region adjacent to the drain region of the first thin-film transistor.

In one preferred embodiment, a part of the drain region of the first thin-film transistor, including the drain contact portion, and the second gettering region are located in the second end portion. Respective parts of the source and drain regions, and the channel region of the first thin-film transistor are located in the intermediate portion.

Effects of the Invention

The present invention provides an active-matrix substrate that can suppress not only a sudden increase in the OFF-state current of a TFT but also the generation of leakage current between gate and source bus lines.

BRIEF DESCRIPTION OF DRAWINGS

FIG. 1 schematically illustrates an active-matrix substrate as a first specific preferred embodiment of the present invention, wherein FIG. 1(a) is a schematic plan view, FIG. 1(b) illustrates a first end portion of the semiconductor layer and its surrounding portions, and FIG. 1(c) is a schematic cross-sectional view as viewed on the plane A-A' shown in FIG. 1(a).

FIGS. 4(a) through 4(h) are schematic views illustrating respective processing steps of the manufacturing process of an active-matrix substrate according to the first preferred embodiment.

FIG. 7 schematically illustrates an arrangement for an active-matrix substrate according to a second preferred embodiment of the present invention, wherein FIG. 7(a) is a schematic plan view thereof and FIG. 7(b) is an enlarged view illustrating the first end portion of the semiconductor layer and its surrounding portions.

Figure 1:
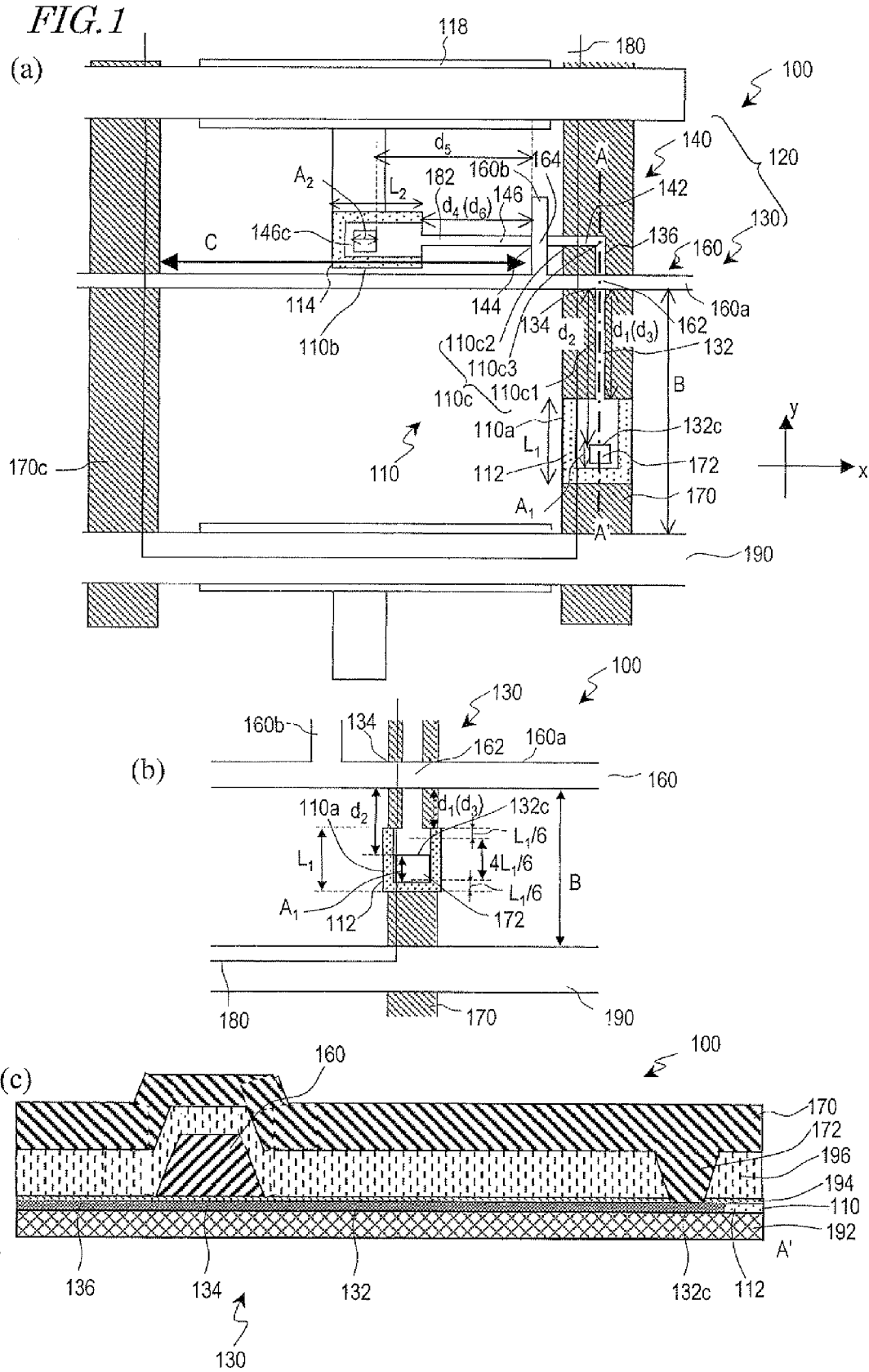

DESCRIPTION OF REFERENCE NUMERALS 100 active-matrix substrate
110 semiconductor layer
112, 114 gettering region
120 TFT element
130, 140, 150 TFT
132, 142, 152 source region
132c source contact portion
134, 144, 154 channel region
136, 146, 156 drain region
136c, 146c drain contact portion
160 gate bus line
162, 164, 166 gate electrode
170 source bus line
172 source electrode
180 pixel electrode
182 drain electrode

BEST MODE FOR CARRYING OUT THE INVENTION

Hereinafter, preferred embodiments of an active-matrix substrate according to the present invention will be described with reference to the accompanying drawings. It should be noted, however, that the present invention is in no way limited to the specific preferred embodiments to be described below.

Embodiment 1

A first specific preferred embodiment of an active-matrix substrate according to the present invention will be described now.

FIG. 1 schematically illustrates an active-matrix substrate 100 as a first specific preferred embodiment of the present invention, wherein FIG. 1(a) is a schematic plan view of the active-matrix substrate 100, FIG. 1(b) illustrates a first end portion 110a of the semiconductor layer 110 of the active-matrix substrate 100 and its surrounding portions, and FIG. 1(c) is a schematic cross-sectional view as viewed on the plane A-A' shown in FIG. 1(a).

The active-matrix substrate 100 includes a semiconductor layer 110, a thin-film transistor element 120 (which will be referred to herein as "TFT element") including first and second thin-film transistors 130 and 140 that operate as pixel TFTs, a gate bus line 160, a source bus line 170 and a pixel electrode 180. Also, a storage capacitor line 190 is arranged parallel to the gate bus line 160. Both of the TFTs 130 and 140 of the TFT element 120 have an LDD structure. And the TFTs 130 and 140 are connected in series with each other, thereby reducing the amount of OFF-state current that could flow through the TFT element 120.

The source, channel and drain regions 132, 134 and 136 of the TFT 130 and the source, channel and drain regions 142, 144 and 146 of the TFT 140 are included in the semiconductor layer 110. The source region 132 of the TFT 130 has a source contact portion 132c in contact with a source electrode 172 that is electrically connected to the source bus line 170. Meanwhile, the drain region 146 of the TFT 140 has a drain contact portion 146c in contact with a drain electrode 182 that is electrically connected to the pixel electrode 180. Also, the drain region 136 of the TFT 130 and the source region 140 of the TFT 140 are continuous with each other.

The semiconductor layer 110 has been made by a CGS process using nickel as a catalyst element. Also, the semiconductor layer 110 has first and second gettering regions 112 and 114 for removing the catalyst element by gettering. Although the source and drain regions of a TFT could sometimes perform gettering for removing a catalyst element, the "gettering regions" of this preferred embodiment have a gettering element at a higher concentration than the source and drain regions. The first gettering region 112 is adjacent to the source region 132 of the TFT 130, while the second gettering region 114 is adjacent to the drain region 146 of the TFT 140.

The semiconductor layer 110 has three portions, namely, a first end portion 110a, a second end portion 110b and an intermediate portion 110c between the first and second end portions 110a and 110b. In the first end portion 110a, located are a part of the source region 132, including the source contact portion 132c, and the gettering region 112. On the other hand, in the second end portion 110b, located are a part of the drain region 146, including the drain contact portion 146c, and the gettering region 114. And in the intermediate portion 110c, located are a part of the source region 132, the channel region 134 and the drain region 136 of the TFT 130 and the source and channel regions 142 and 144 and a part of the drain region 146 of the TFT 140. The intermediate portion 110c includes a first linear portion 110c1 running in the y direction, a second linear portion 110c2 running in the x direction, and a connecting portion 110c3 between the first and second linear portions 110c1 and 110c2. The first linear portion 110c1 is overlapped by the source bus line 170. The semiconductor layer 110 further has an opposing portion 118 that is continuous with the second end portion 110b and that faces the storage capacitor line 190. The opposing portion 118 has a T shape.

The gate bus line 160 has a trunk portion 160a running in the x direction and a branch portion 160b extending from the trunk portion 160a and running in the y direction. And each of the trunk and branch portions 160a and 160b overlaps with the semiconductor layer 110 at a single point. A part of the semiconductor layer 110 overlapped by the gate bus line 160 functions as a channel region. And there are two channel regions 134 and 144 in the semiconductor layer 110. Of these two channel regions 134 and 144, the channel region 134 is located closer to the first gettering region 112, while the channel region 144 is located closer to the second gettering region 114. Also, portions of the gate bus line 160 associated with the channel regions 134 and 136 will function as the gate electrodes 162 and 164 of the TFTs 130 and 140, respectively.

The source bus line 170 runs in the y direction and overlaps with a part of the intermediate portion 110c and the first end portion 110a of the semiconductor layer 110. That is why the black matrix for the source bus line 170 can also be used to shield these portions, thus suppressing the decrease in aperture ratio.

The first gettering region 112 is arranged in the outer periphery of the first end portion 110a so as not to block the electrical charge path leading from the source contact portion 132c to the channel region 134. Likewise, the second gettering region 114 is arranged in the outer periphery of the second end portion 110b so as not to block, the electrical charge path leading from the channel region 144 to the drain contact portion 146c. Also, the first and second gettering regions 112 and 114 are arranged close to the channel regions 134 and 144, respectively. Specifically, the gettering region 112 is arranged in contact with one side of the rectangular first end portion 110a that is located closer to the channel region 134, while the gettering region 114 is arranged in contact with one side of the rectangular second end portion 110b that is located closer to the channel region 144. In this manner, the first and second gettering regions 112 and 114 are arranged near the channel regions 134 and 144 and in the outer periphery of the first and second end portions 110a and 110b, respectively, thereby achieving high gettering performance.

Suppose the length of the shortest line segment that connects together the channel region 134 of the TFT 130 and the gettering region 112 as measured by projecting the line segment onto a line that connects together the channel region 134 of the TFT 130 and the source contact portion 132c is identified by $d_1$ and the distance from the channel region 134 of the TFT 130 to the source contact portion 132c in the semiconductor layer 110 is identified by $d_2$. It should be noted that $d_2$ corresponds to the distance between the gate bus line 160 located over the channel region 134 and the source electrode 172 that contacts with the source contact portion 132c. The source contact portion 132c is arranged away from a side of the first end portion 110a closer to the channel region 134, and therefore, $d_2$ is greater than $d_1$.

Also, suppose the distance from the channel region 134 of the TFT 130 to the first end portion 110a of the semiconductor layer 110 is identified by $d_3$. In this example, the first gettering region 112 is arranged in contact with one side of the first end portion 110a closer to the channel region 134 and $d_3$ is equal to $d_1$. Furthermore, suppose the length of the first end portion 110a as measured along a line that connects together the channel region 134 of the TFT 130 and the source contact portion 132c is identified by $L_1$ and the length of the source contact portion 132c as measured along the line that connects together the channel region 134 of the TFT 130 and the source contact portion 132c is identified by $A_1$.

The present inventors discovered that as $d_1$ was decreased to suppress the sudden increase in the OFF-state current of a TFT, $d_2$ also decreased, thus increasing the amount of leakage current flowing between the gate bus line and the source bus line after all. To overcome such a problem, in the active-matrix substrate 100 of this preferred embodiment, the source contact portion 132c is provided in order to increase $d_2$, thereby suppressing the sudden increase in the OFF-state current of the TFT 130 and minimizing the amount of leakage current flowing between the gate bus line 160 and the source bus line 170.

Figure 2:
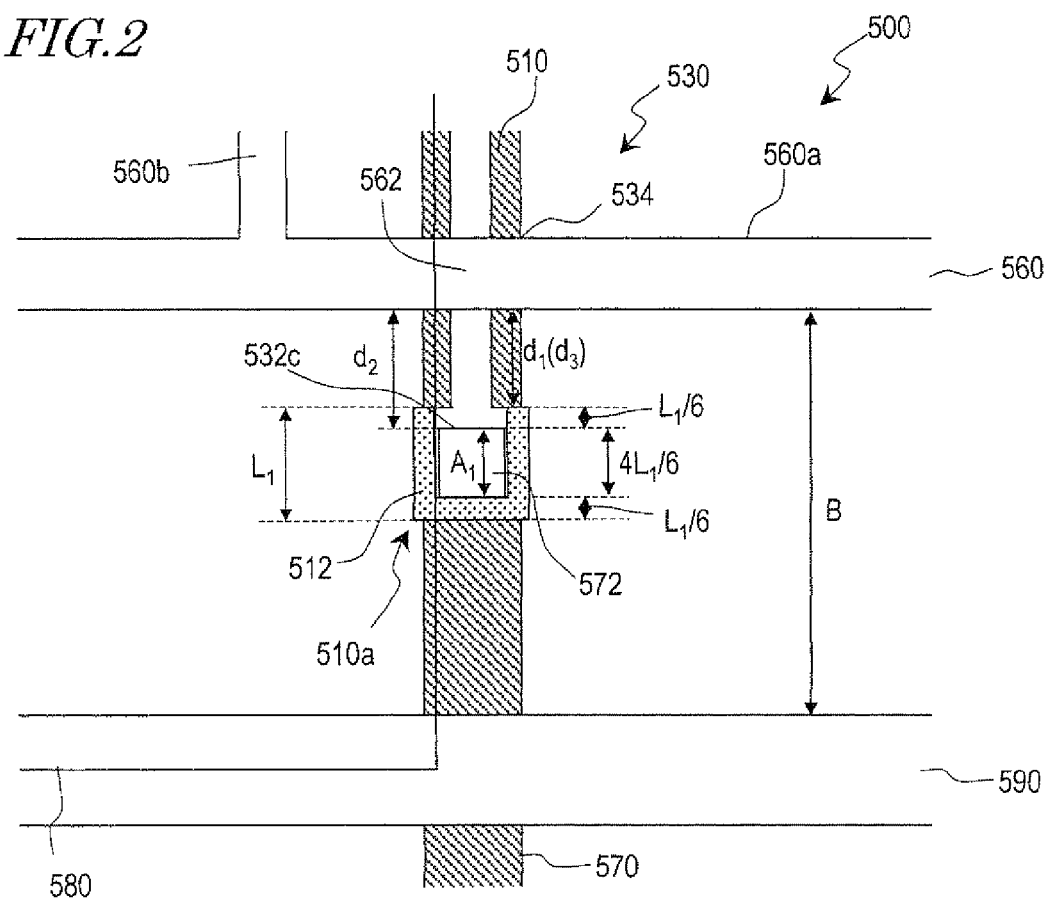
FIG. 2 is an enlarged view illustrating a first end portion of the semiconductor layer of the active-matrix substrate as Comparative Example 1 and its surrounding portions.

Hereinafter, the advantages of the active-matrix substrate 100 of this preferred embodiment over an active-matrix substrate 500 as Comparative Example 1 will be described. FIG. 2 is a schematic plan view illustrating a first end portion 510a of the semiconductor layer 510 of the active-matrix substrate 500 as Comparative Example 1 and its surrounding portions. The active-matrix substrate 500 of Comparative Example 1 has the similar configuration as the active-matrix substrate 100 shown in FIG. 1 except $d_2$ and $L_1$.

In the active-matrix substrate 500 of Comparative Example 1, suppose the length of the shortest line segment that connects together the channel region 534 of the TFT 530 and the gettering region 512 as measured by projecting the line segment onto a line that connects together the channel region 534 of the TFT 530 and the source contact portion 532c is identified by $d_1$ and the distance from the channel region 534 of the TFT 530 to the source contact portion 532c in the semiconductor layer 510 is identified by $d_2$ as in the active-matrix substrate 100. Also, suppose the length of the first end portion 510a as measured along a line that connects together the channel region 534 of the TFT 530 and the source contact portion 532c is identified by $L_1$ and the length of the source contact portion 532c as measured along the line that connects together the channel region 534 of the TFT 530 and the source contact portion 532c is identified by $A_1$.

In the active-matrix substrate 500 of Comparative Example 1, the first end portion 510a has a shortened length $L_1$, and therefore, the amount of impurities that could enter the first end portion 510a can be reduced. $L_1$ may be 6 μm, for example.

On the other hand, to electrically connect the first end portion 510a of the semiconductor layer 510 and the source electrode 572 more securely, the source contact portion 532c has an increased length $A_1$. As a result, the source electrode 572 comes to have an increased cross-sectional area and decreased electrical resistance. $A_1$ may be 4 μm, for example. Also, taking misalignment that could occur during the patterning process into account, the active-matrix substrate of this comparative example is designed such that the source contact portion 532c is located at the center of the first end portion 510a. It should be noted that the first end portion 510a surrounding the source contact portion 532c has a width of 1.0 μm, which is the margin of the source contact portion 532c. With possible patterning error and etching shift taken into account, a margin of 1.0 μm is left. The gettering region 512 also has a width of 1.0 μm. In order to prevent the source contact resistance from varying due to non-uniformity in the concentration of a gettering element, the first gettering region 512 is ideally arranged so as not to overlap with the source contact portion 532c.

Furthermore, in the active-matrix substrate 500 of Comparative Example 1, $d_1$ is reduced to shorten the distance between the channel region 534 and the first gettering region 512. With such a short $d_1$, the catalyst element in the channel region 534 can be sufficiently removed into the gettering region 512 by gettering and the sudden increase in the OFF-state current of the TFT 530 can be suppressed. $d_1$ may be 5 μm, for example.

In the active-matrix substrate 500, however, since $A_1$ is increased with $L_1$ decreased, $d_2$, as well as $d_1$, has decreased, and therefore, the distance from the gate bus line 560 to the source electrode 572 has shortened. For example, if $L_1$ is 6 μm, $A_1$ is 4 μm and $d_1$ is 5 m, as described above, $d_2$ becomes 6 μm. For that reason, in the active-matrix substrate 500 of Comparative Example 1, if the conductor material of the gate bus line 560 were left around the gate bus line 560 being formed by a patterning process, then leakage current would flow between the gate bus line 560 and the source bus line 570 by way of the residual conductor material and the source electrode 572, thus sometimes causing a line defect.

In the active-matrix substrate 100, on the other hand, the center of the source contact portion 132c is located more distant from the channel region 134 of the TFT 130 than that of the first end portion 110a is. That is why by increasing $d_2$ with $d_1$ kept as short as the comparative example, the distance between the gate bus line 160 and the source bus line 170 can be increased, and therefore, it is possible to prevent leakage current from flowing between the gate bus line 160 and the source bus line 170.

In addition, since the active-matrix substrate 100 is designed to increase $d_2$ with $d_1$ kept short, there is an increased difference between $d_2$ and $d_1$ with respect to $L_1$. Specifically, the active-matrix substrate 100 satisfies $d_2-d_1>L_1/6$. In the active-matrix substrate 100, $L_1$, $A_1$, $d_1$ and $d_2$ may be 9 μm, 4 μm, 5 μm and 9 μm, respectively. Also, the distance between the source contact portion 132c and the first gettering region 112 is ideally 0 μm, but may also be 0.5 to 1.0 μm.

Furthermore, the ratio of $L_1$ to $A_1$ is relatively high and satisfies $L_1>1.5\times A_1$. As a result, the source contact portion 132c can be designed more flexibly with respect to the first end portion 110a.

Furthermore, supposing the distance from the trunk portion 160a of the gate bus line 160 to the storage capacitor line 190 is identified by B, the active-matrix substrate 100 of this preferred embodiment satisfies $B \geq 2d_2+A_1$. As a result, the distance from the storage capacitor line 190 to the source electrode 172 becomes longer than $d_2$, and therefore, leakage current can be substantially eliminated from not only between the source electrode 172 and the gate bus line 160 but also between the source electrode 172 and the storage capacitor line 190 as well. The active-matrix substrate 100 may have an $A_1$ of 4 and a B of 64 μm, for example.

Also, supposing a dimension of the semiconductor layer 110 that is perpendicular to the direction in which electrical charge flows from the source contact portion 132c toward the drain contact portion 146c is the "width", the width of the first end portion 110a (i.e., the length of the first end portion 110a as measured in the x direction) and that of the second end portion 110b (i.e., the length of the second end portion 110b as measured in the y direction) are both 8.5 μm as shown in FIG. 1(a). Also, the intermediate portion 110c has an L shape running in the x and y directions and has a width of 3 μm. Thus, the first and second end portions 110a and 110b have a greater width than the intermediate portion 110c. And as the intermediate portion 110c including the channel regions 134 and 144 has a narrow width, the OFF-state current that could flow through the TFT element 120 can be reduced.

Also, the source contact portion 132c has a length of 4 μm both in the x and y directions, so does the drain contact portion 146c. Meanwhile, the first and second gettering regions 112 and 114 arranged on the outer periphery of the first and second end portions 110a and 110b have a width of 1.0 μm.

As can be seen, the active-matrix substrate 100 can make $d_2$ longer than in the active-matrix substrate 500 of Comparative Example 1, while keeping $d_1$ as short as in active-matrix substrate 500. As a result, the active-matrix substrate 100 can not only suppress a sudden increase in the OFF-state current of the TFT 130 but also substantially eliminate the leakage current that could flow between the gate bus line 160 and the source bus line 170 as well, thus reducing the number of point and line defects in a display device.

In the active-matrix substrate 100 of this preferred embodiment, $d_1$ preferably satisfies 3 μm $\leq d_1 \leq$ 13 μm. If $d_1$ was greater than 13 μm, the concentration profile of the catalyst element would be so gentle even with the gettering region that the catalyst element could remain in the channel region to cause such a sudden increase in the OFF-state current of the TFT easily. For that reason, $d_1$ of the active-matrix substrate 100 is preferably 13 μm or less. Also, the TFT 130 has the LDD structure and there is a lightly doped region (not shown) between the channel region 134 and the gettering region 112. If $d_1$ were smaller than 3 μm, however, it should be difficult to arrange the lightly doped region just as intended. That is why the active-matrix substrate 100 preferably has a $d_1$ of 3 μm or more. Also, since there is a constant narrow gap between the three sides of the rectangular source contact portion 132c and the first gettering region 112, high gettering performance is realized.

Furthermore, $d_2$ preferably satisfies 8 μm $\leq d_2 \leq$ 30 μm. If $d_2$ were less than 8 μm, leakage current would be produced more easily between the gate bus line 160 and the source bus line 170. For that reason, the active-matrix substrate 100 preferably has a $d_2$ of at least 8 μm. Also, in a situation where the distance B between the gate bus line 160 and the storage capacitor line 190 is 64 μm, if $d_2$ were greater than 30 μm, then the gap between the storage capacitor line 190 and the source electrode 172 would be so narrow that leakage current could flow between the storage capacitor line 190 and the source electrode 172. That is why the active-matrix substrate 100 preferably has a $d_2$ of at most 30 μm. It should be noted that $d_1$ and $d_2$ could be measured with an optical microscope.

Furthermore, in the active-matrix substrate 100, the semiconductor layer 110 runs straight from the channel region 134 through the source contact portion 132c parallel to the source bus line 170. As a result, d2 is increased with d1 decreased, and point and line defects can be reduced, too. On top of that, since the channel region 134 is covered with the source bus line 170, there is no need to provide any opaque portion to cover the channel region 134, and therefore, operation errors can be reduced significantly.

In the preferred embodiment described above, $L_1$ and $A_1$ of the active-matrix substrate 100 satisfy $L_1>1.5\times A_1$, thus allowing the designer to arrange the source contact portion 132c more flexibly. Considering possible design errors, however, $L_1>2\times A_1$ is more preferably satisfied.

Figure 3:
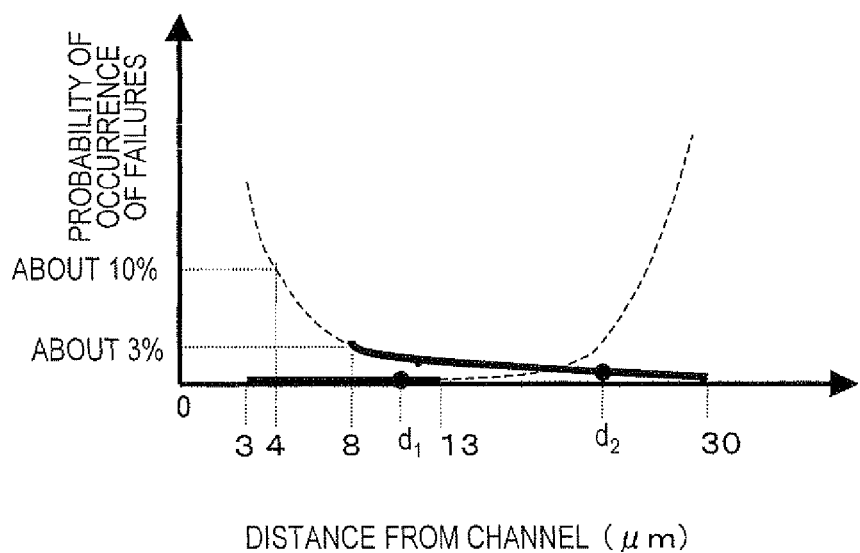
FIG. 3 is a graph showing how the probability of occurrence of failures changes with $d_1$ and $d_2$.

FIG. 3 is a graph showing how the probability of occurrence of failures changes with $d_1$ and $d_2$. In FIG. 3, the solid curve represents the relation between $d_1$ and the probability of occurrence of failures, while the dashed curve represents the relation between $d_2$ and the probability occurrence of failures. As used herein, the failures associated with $d_1$ are point defects caused by OFF-state current, while the failures associated with $d_2$ are line defects. These point and line defects are detected by directly observing a display device including the active-matrix substrate with the naked eye.

As can be seen from FIG. 3, the greater $d_1$, the higher the probability of occurrence of point defects. This is because as $d_1$ increases, more and more catalyst element cannot be removed by gettering but remain in the channel region. As shown in FIG. 3, by setting $d_1$ to be equal to or smaller than 13 μm, the probability of occurrence of point defects can be reduced to substantially 0%. For that reason, $d_1$ is preferably set to be equal to or smaller than 13 μm. Strictly speaking, however, even if $d_1$ is set to be 13 μm, $d_1$ could still vary actually to the point that some point defects are generated.

Also, the smaller $d_2$, the more likely leakage current flows between the gate and source bus lines to generate line defects. To reduce the probability of occurrence of line defects to approximately 3% or less, $d_2$ should be equal to or greater than 8 μm as shown in FIG. 3. The active-matrix substrate 100 described above is designed so as to increase $d_2$ while keeping $d_1$ short. As a result, the catalyst element remaining in the channel region 134 can be removed by gettering, thereby suppressing not only a sudden increase in the OFF-state current and the generation of leakage current between the gate bus line 160 and the source bus line 170.

In the example described above, the point and line defects are supposed to be detected by directly observing the display device with the naked eye. However, the present invention is in no way limited to that specific preferred embodiment. The point and line defects may also be spotted based on the number and luminances of failures by observing it with the naked eye through a neutral density (ND) filter, which reduces the transmitted light to 10%, for example.

Although FIG. 1 illustrates only the display area of the active-matrix substrate 100, the active-matrix substrate may also have a built-in driver and gate and source drivers with TFTs may be integrated together in the peripheral area thereof. In that case, the semiconductor layer of TFTs for use in those drivers (which will be referred to herein as "driver TFTs") may also be made by the CGS process as in the display area. In the driver TFTs, a portion of the semiconductor layer from under the gate electrode through the first end portion may have a length (which corresponds to $d_1$) of 1 to 3 μm, while another portion of the semiconductor layer from under the gate electrode through the source contact portion may have a length (which corresponds to $d_2$) of 1.5 to 3.5 μm. Thus, $d_1$ and $d_2$ of the driver TFTs are longer than those of pixel TFTs.

Also, in the example described above, the gettering regions 112 and 114 are supposed to have a width of 1.0 μm. However, to leave a sufficient margin for misalignments and etching shifts that could occur during the patterning process, the gettering regions 112 and 114 may have a width of more than 1 μm and preferably have a width of 1.75 μm, for example. In that case, that portion of the semiconductor layer 110 from the channel region 134 through the first end portion 110a may have a length $d_1$ of 5 μm, and the first end portion 110a may have a length $L_1$ of 11.75 μm as measured in the y direction. In the first end portion 110a, the length from one side of the first end portion 110a closer to the channel region 134 through the source contact portion 132c (i.e., the difference between $d_2$ and $d_1$) may be 5.5 μm, while the length from the source contact portion 132c through the other side of the first end portion 110a opposite to the channel region 134 may be 2.25 μm. In the first end portion 110a, the source contact portion 132c is arranged closer to the other side opposite to the channel region 134 than the one side closer to the channel region 134. The lower limit of the ratio of $L_1$ to $A_1$ is 1.5 but its upper limit may be defined by $(B-d_3)/A_1$, because the maximum value of $L_1$ is $B-d_3$. Such an active-matrix substrate 100 may be used in a liquid crystal display device, for example.

Hereinafter, it will be described with reference to FIG. 4 how to make the active-matrix substrate 100 of this preferred embodiment. FIGS. 4(a) through 4(h) are cross-sectional views as viewed on the same plane as FIG. 1(b).

First of all, an insulating substrate 192 is provided as shown in FIG. 4(a). The insulating substrate 192 may be a glass substrate, for example.

Next, as shown in FIG. 4(b), a base coating film (not shown) is deposited on the insulating substrate 192 and then a semiconductor layer 110 is deposited on the base coating film. In this process step, the semiconductor layer is an amorphous semiconductor layer.

Subsequently, as shown in FIG. 4(c), a catalyst element is added to the semiconductor layer 110. The catalyst element may be nickel, for example. Nickel may be added by applying an aqueous solution of nickel acetate over the surface of the semiconductor layer 110 uniformly and then drying it. Next, the semiconductor layer 110 is heated to get crystallized and be a crystalline semiconductor layer. Then, the semiconductor layer 110 is patterned, thereby forming the end portions 110a and 110b and intermediate portion 110c of the semiconductor layer 110 shown in FIG. 1(a).

Thereafter, as shown in FIG. 4(d), a gate insulating film 194 is formed on the semiconductor layer 110. Subsequently, a conductive material is deposited on the gate insulating film 194 and then patterned to form a gate bus line 160.

Next, as shown in FIG. 4(e), a dopant is introduced into the semiconductor layer 110 using the gate bus line 160 as a mask. As a result, the dopant gets introduced into portions of the semiconductor layer 110 to be the source and drain regions 132 and 136 of the TFT 130 and the source and drain regions 142 and 146 of the TFT 140 shown in FIG. 1(a). If n-channel TFTs are going to be fabricated as the TFT element 120, the dopant may be phosphorus, for example. On the other hand, if p-channel TFTs are going to be fabricated as the TFT element 120, the dopant may be boron, for example. The source regions 132, 142 and drain regions 136, 146 of the TFTs 130 and 140 may have a dopant concentration of 2 to $3 \times 10^{20}$ atoms/cm$^3$, for example. It should be noted that the dopant concentration of the lightly doped region (not shown) may be approximately 1/600 of that dopant concentration.

Subsequently, as shown in FIG. 4(f), the semiconductor layer 110 is covered with a resist mask 310 with a predetermined opening and then selected areas of the end portions 110a and 110b shown in FIG. 1(a) are doped with a gettering element, which may be phosphorus, for example. As a result of this doping process, gettering regions 112 and 114 are formed in the end portions 110a and 110b. In the gettering regions 112 and 114, the gettering element may have a concentration of $6 \times 10^{20}$ to $1 \times 10^{21}$ atoms/cm$^3$, for example.

Thereafter, a gettering process is carried out by heating the semiconductor layer 110. Consequently, the catalyst element left in the source, channel and drain regions 132, 134 and 136 shown in FIG. 1(a) is removed mostly into the gettering region 112, while the catalyst element left in the source, channel and drain regions 142, 144 and 146 of the TFT 140 is removed mostly into the gettering region 114.

Subsequently, the resist mask 310 is stripped and then an interlayer dielectric film 196 is deposited instead and etched as shown in FIG. 4(g), thereby exposing the source and drain contact portions 132c and 146c of the semiconductor layer 110 shown in FIG. 1(a).

After that, a conductive material is deposited and then patterned, thereby forming a source electrode 172 and a source bus line 170 as shown in FIG. 4(h). At the same time, a part of the drain electrode 182 (see FIG. 1(a)) is also formed. Thereafter, another interlayer dielectric film (not shown) is deposited and then the rest of the drain electrode 182 and a pixel electrode 180 shown in FIG. 1(a) are formed thereon. In this manner, the active-matrix substrate 100 is completed.

In the preferred embodiment described above, the gettering element is supposed to be introduced using a resist mask. However, if a lot of resist material were used to make the resist mask, then an increased proportion of the resist material would be left on the semiconductor layer 110 and produce some detrimental effects even after the resist mask has been stripped. On top of that, as a gas would be emitted from the surface of the resist mask at a higher rate during the doping process using the resist mask, the accuracy of the doping process would decline. That is why to reduce the amount of the resist material to use, the resist mask could be formed so as not to cover any area with no semiconductor layer 110.

Figure 5:
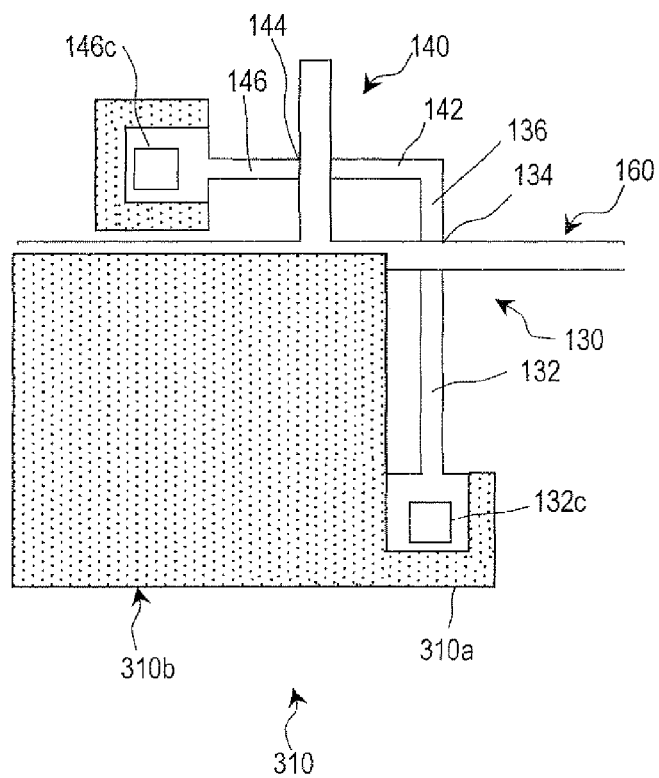
FIG. 5 is a schematic representation illustrating the shape and arrangement of a resist mask for use in the process step of introducing a gettering element in the manufacturing process of the active-matrix substrate according to the first preferred embodiment.

For example, the resist mask 310 could also be formed so as to have not only an opening 310a over the gettering region 112 but also another opening 310b, which is extended from the opening 310a, over a region adjacent to the gettering region 112 as shown in FIG. 5. It should be noted that in order to show the configuration under the resist mask 310 clearly, the openings 310a and 310b of the resist mask 310, through which the gettering element is supposed to be introduced, are shadowed, while the resist mask 310 and the gate insulating film 194 that actually cover the semiconductor layer 110 are illustrated as being see-through in FIG. 5.

With the resist mask 310 shown in FIG. 5, however, if a gettering element was introduced, leakage current could flow through the active-matrix substrate 100 as a final product between the gate bus line 160 and the source bus line 170 by way of the source electrode 172. This is because the opening 310a over the gettering region 112 is continuous with the opening 310b over a region adjacent to the gettering region 112.

Figure 6:
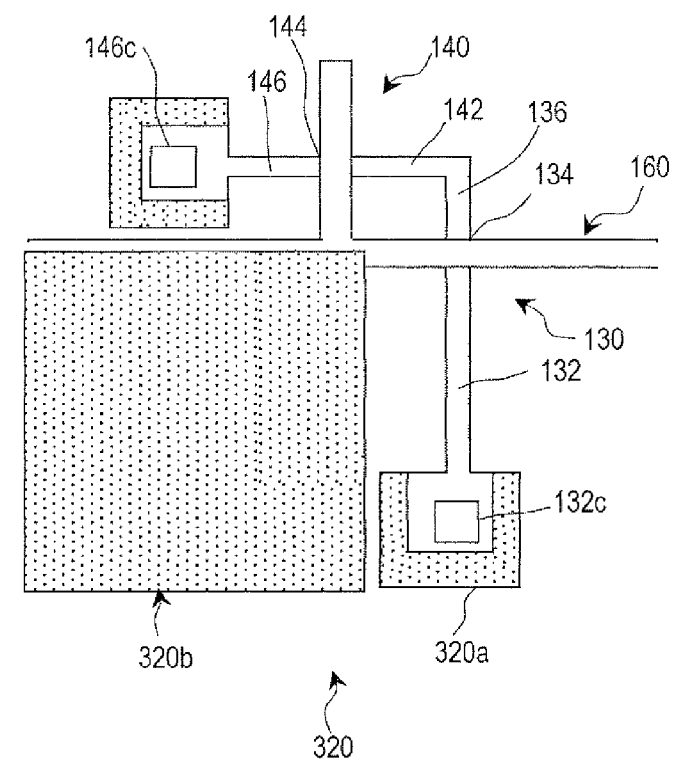
FIG. 6 is a schematic representation illustrating the shape and arrangement of another resist mask for use in the process step of introducing a gettering element in the manufacturing process of the active-matrix substrate according to the first preferred embodiment.

To avoid such a situation, a resist mask 320, of which the opening 320a over the gettering region 112 and the opening 320b over its neighboring region are separate from each other, may be used as the resist mask as shown in FIG. 6. Then, not just the amount of the resist material to use but also the amount of leakage current to flow between the gate bus line 160 and the source bus line 170 can be both reduced, thus minimizing the generation of line defects in the display device.

It should be noted that the gettering element that has passed through the openings of the resist mask will stay on the active-matrix substrate 100. That is why by detecting the dose of the gettering element with a scanning capacitance microscope (SCM), the shapes of the openings of the resist mask that was used to introduce the gettering element can be determined. Alternatively, as a portion of the gate insulating film 194 that has been doped with the gettering element becomes thinner than the rest of the film 194, the shapes of the openings of the resist mask that was used to introduce the gettering element can also be determined by observing a cross section of the panel with a scanning electron microscope (SEM).

In the preferred embodiment described above, the lengths $d_1$, $d_2$, $d_3$, $L_1$ and $A_1$ are defined in association with the source region 132. However, the present invention is in no way limited to that specific preferred embodiment. Alternatively, suppose the length of the shortest line segment that connects together the channel region 144 of the TFT 140 and the second gettering region 114 as measured by projecting the line segment onto a line that connects together the channel region 144 and the drain contact portion 146c (i.e., a line running in the x direction shown in FIG. 1(a)) is identified by $d_4$ and the distance from the channel region 144 to the drain contact portion 146c in the semiconductor layer 110 is identified by $d_5$. Also, suppose the distance from the channel region 144 of the TFT 140 to the second end portion 110b of the semiconductor layer 110 is identified by $d_6$. Furthermore, suppose the length of the drain contact portion 146c as measured along the line that connects together the channel region 144 of the TFT 140 and the drain contact portion 146c is identified by $A_2$ and the length of the second end portion 110b as measured along a line that connects together the channel region 144 of the TFT 140 and the drain contact portion 146c is identified by $L_2$. In that case, the active-matrix substrate 100 satisfies $d_5+A_2/2>d_6+L_2/2$, thus suppressing not only a sudden increase in OFF-state current but also the generation of leakage current between the gate bus line 160 and the pixel electrode 180 by way of the drain electrode 182. Also, $d_4$ and $d_5$ satisfy 3 μm≤$d_4$≤13 μm and 8 μm≤$d_5$≤30 μm, respectively. Furthermore, supposing the distance between the channel region 144 of the TFT 140 and an adjacent source bus line 170c next to the source bus line 170 is identified by C, the active-matrix substrate 100 satisfies $d_5$<C−$A_2$, thus arranging the drain electrode 182 between the source bus line 170 and the adjacent source bus line 170c.

In the arrangement shown in FIG. 1(a), the distance between the branch portion 160b of the gate bus line 160 and the drain electrode 182 is longer than the distance between the trunk portion 160a of the gate bus line 160 and the drain electrode 182. However, the amount of the conductive material to be left around the branch portion 160b being patterned is greater than that of the conductive material to be left around the trunk portion 160a. That is why by increasing $d_5$, the amount of leakage current to flow between the gate bus line 160 and the pixel electrode 180 by way of the drain electrode 182 can be reduced significantly.

In the preferred embodiment described above, the gettering regions 112 and 114 are supposed to be arranged adjacent to the source and drain regions 132 and 146, respectively. However, the present invention is in no way limited to that specific preferred embodiment. Just the gettering region 112 needs to be provided. This is because if leakage current were flowing between the gate and source bus lines, a number of line defects would be produced in a display device, thus affecting the yield of display devices significantly.

Also, in the preferred embodiment described above, the gettering regions 112 and 114 are arranged in contact with one side of the rectangular end portion 110a closer to the channel region 134 and one side of the rectangular end portion 110b closer to the channel region 144, respectively, and $d_1$ and $d_4$ are supposed to be as long as the distances $d_3$ and $d_6$ from the channel regions 134 and 144 of TFTs 130 and 140 to the end portions 110a and 110b of the semiconductor layer 110. However, the present invention is in no way limited to that specific preferred embodiment. Alternatively, the gettering regions 112 and 114 do not have to be in contact with those sides of the end portions 110a and 110b closer to the channel regions 134 and 144 and $d_1$ and $d_4$ may be longer than $d_3$ and $d_6$, respectively.

Embodiment 2

In the active-matrix substrate of the first preferred embodiment described above, the TFT element includes two TFTs. However, the present invention is in no way limited to that specific preferred embodiment. Naturally, the TFT element of the active-matrix substrate may include three TFTs.

FIG. 7 schematically illustrates a second preferred embodiment of an active-matrix substrate according to the present invention. Specifically, FIG. 7(a) is a plan view schematically illustrating the active-matrix substrate 100 of this preferred embodiment, and FIG. 7(b) is an enlarged view illustrating the first end portion 110a of the semiconductor layer 110 and its surrounding portions on the active-matrix substrate 100 on a larger scale.

The active-matrix substrate 100 of this preferred embodiment has the similar configuration as the counterpart of the first preferred embodiment shown in FIG. 1 except that the TFT element 120 includes three thin-film transistors (TFTs) 130, 140 and 150. Thus, the common description will be omitted herein to avoid redundancies. The three TFTs 130, 140 and 150 of the TFT element 120 are arranged in series with each other with the TFT 130 arranged at one end and the TFT 140 arranged at the other. That is to say, the TFTs 130, 140 and 150 of the TFT element 120 are arranged in the order of the TFTs 130, 150 and 140 from the source contact portion 132c toward the drain contact portion 146c.

The gate bus line 160 includes not only the trunk portion 160a running in the x direction and the branch portion 160b extended from the trunk portion 160a to run in the y direction but also another branch portion 160c extended from the trunk portion 160a in the opposite direction to the branch portion 160b and then turned to run in the direction. Each of the trunk portion 160a and the branch portions 160b and 160c overlaps with the semiconductor layer 110 at a single point. Those portions of the semiconductor layer 110 overlapped by the gate bus line 160 serve as channel regions. That is to say, there are three channel regions 134, 144 and 154 in the semiconductor layer 110. Of these three channel regions 134, 144 and 154, the channel region 134 is located close to the first gettering region 112, while the channel region 144 is located close to the second gettering region 114. And portions of the gate bus line 160 that are associated with the channel regions 134, 144 and 154 will be the gate electrodes 162, 164 and 166 of the TFTs 130, 140 and 150. The drain region 136 of the TFT 130 is continuous with the source region 152 of the TFT 150. And the drain region 156 of the TFT 150 is continuous with the source region 142 of the TFT 140.

Supposing the length of the shortest line segment that connects together the channel region 134 of the TFT 130 and the first gettering region 112 as measured by projecting the line segment onto a line that connects together the channel region 134 and the source contact portion 132c is identified by $d_1$ and the distance from the channel region 134 to the source contact portion 132c in the semiconductor layer 110 is identified by $d_2$. Furthermore, suppose the length of the first end portion 110a as measured along a line that connects together the channel region 134 of the TFT 130 and the source contact portion 132c is identified by $L_1$. In that case, the active-matrix substrate 100 of this preferred embodiment is designed so as to satisfy $d_2+A_1/2>d_3+L_1/2$ just like the active-matrix substrate of the first preferred embodiment described above. The active-matrix substrate 100 of this preferred embodiment also satisfies $d_2-d_1>L_1/6$ and $L_1 \geq 1.5 \times A_1$.

As already described with reference to FIG. 3, in the active-matrix substrate 100 of this preferred embodiment, $d_1$ is set to be equal to or smaller than 13 µm to reduce the probability of occurrence of point defects to substantially zero percent. Specifically, the active-matrix substrate 100 may satisfy 3 µm≤$d_1$≤13 µm and 8 µm≤$d_2$≤30 µm, for example.

Figure 8:
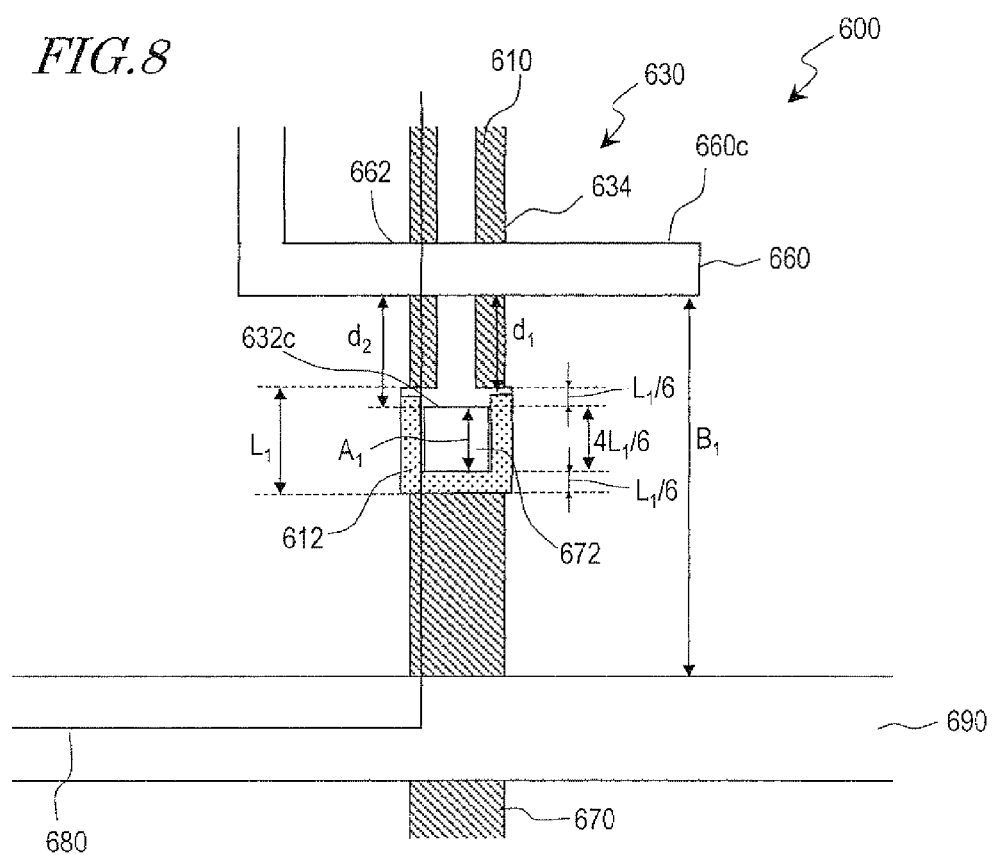
FIG. 8 is an enlarged view illustrating a first end portion of the semiconductor layer of the active-matrix substrate as Comparative Example 2 and its surrounding portions.

Hereinafter, the advantages of the active-matrix substrate 100 of this preferred embodiment over an active-matrix substrate 600 as Comparative Example 2 will be described. FIG. 8 is an enlarged view illustrating a first end portion 610a of the semiconductor layer 610 of the active-matrix substrate 600 as Comparative Example 2 and its surrounding portions. The active-matrix substrate 600 of Comparative Example 2 has the similar configuration as the active-matrix substrate 100 shown in FIG. 7 except $d_2$ and $L_1$.

In the active-matrix substrate 600 of Comparative Example 2, suppose the length of the shortest line segment that connects together the channel region 634 of the TFT 630 and the gettering region 612 as measured by projecting the line segment onto a line that connects together the channel region 634 of the TFT 630 and the source contact portion 632c is identified by $d_1$ and the distance from the channel region 634 of the TFT 630 to the source contact portion 632c in the semiconductor layer 610 is identified by $d_2$ as in the active-matrix substrate 100. Also, suppose the length of the first end portion 610a as measured along a line that connects together the channel region 634 of the TFT 630 and the source contact portion 632c is identified by $L_1$ and the length of the source contact portion 632c as measured along the line that connects together the channel region 634 of the TFT 630 and the source contact portion 632c is identified by $A_1$.

In the active-matrix substrate 600 of Comparative Example 2, the first end portion 610a has a shortened length $L_1$, and therefore, not only the amount of impurity elements that could enter the first end portion 610a but also the parasitic capacitance between the first end portion 610a of the semiconductor layer 610 and the source bus line 670 can be reduced. $L_1$ may be 6 µm, for example. On the other hand, to electrically connect the first end portion 610a of the semiconductor layer 610 and the source electrode 672 more securely, the source contact portion 632c has an increased length $A_1$. As a result, the source electrode 672 comes to have an increased cross-sectional area and decreased electrical resistance. $A_1$ may be 4 µm, for example. Also, taking misalignment that could occur during the patterning process into account, the active-matrix substrate of this comparative example is designed such that the source contact portion 632c is located at the center of the first end portion 610a. It should be noted that the first end portion 610a surrounding the source contact portion 632c has a width of 1.0 µm, which is the margin of the source contact portion 632c. With possible patterning error and etching shift taken into account, a margin of 1.0 µm is left. The gettering region 612 also has a width of 1.0 µm.

Furthermore, in the active-matrix substrate 600 of Comparative Example 2, $d_1$ is reduced to shorten the distance between the channel region 634 and the first gettering region 612. With such a short $d_1$, the catalyst element in the channel region 634 can be sufficiently removed into the gettering region 612 by gettering and the sudden increase in the OFF-state current of the TFT 630 can be suppressed. $d_1$ may be 5 µm, for example.

In the active-matrix substrate 600, however, since $A_1$ is increased with $L_1$ decreased, $d_2$, as well as $d_1$, has decreased, and therefore, the distance from the gate bus line 660 to the source electrode 672 has shortened. For example, if $L_1$ is 6 µm, $A_1$ is 4 µm and $d_1$ is 5 µm, as described above, $d_2$ becomes 6 µm. For that reason, in the active-matrix substrate 600 of Comparative Example 2, if the conductor material of the gate bus line 660 were left around the gate bus line 660 being formed by a patterning process, then leakage current would flow between the gate bus line 660 and the source bus line 670 by way of the residual conductor material and the source electrode 672, thus sometimes causing a line defect.

In the active-matrix substrate 100, on the other hand, the center of the source contact portion 132c is located more distant from the channel region 134 of the TFT 130 than that of the first end portion 110a is. That is why even if $d_1$ in the active-matrix substrate 100 of this preferred embodiment is kept as short as in the active-matrix substrate 600 of this Comparative Example 2, $d_2$ in the active-matrix substrate 100 can still be longer than in the active-matrix substrate 600 of Comparative Example 2. Consequently, the active-matrix substrate 100 can not only suppress the sudden increase in the OFF-state current of the TFT 130 but also prevent leakage current from flowing between the gate bus line 160 and the source bus line 170, thus minimizing the number of point and line defects to be caused in a display device.

Figure 9:
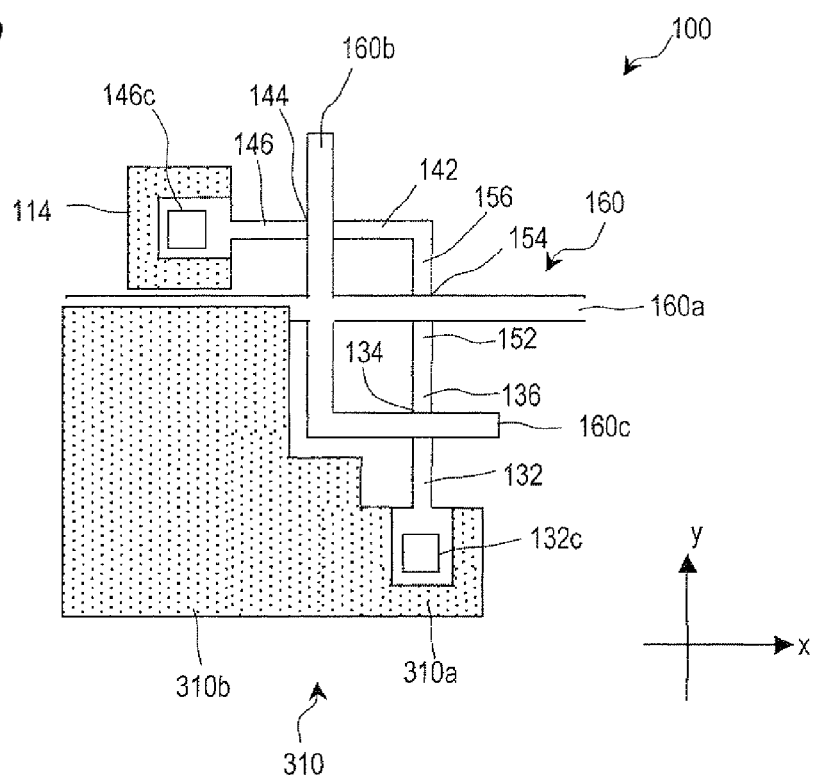
FIG. 9 is a schematic representation illustrating the shape and arrangement of a resist mask for use in the process step of introducing a gettering element in the manufacturing process of the active-matrix substrate according to the second preferred embodiment.
Figure 10:
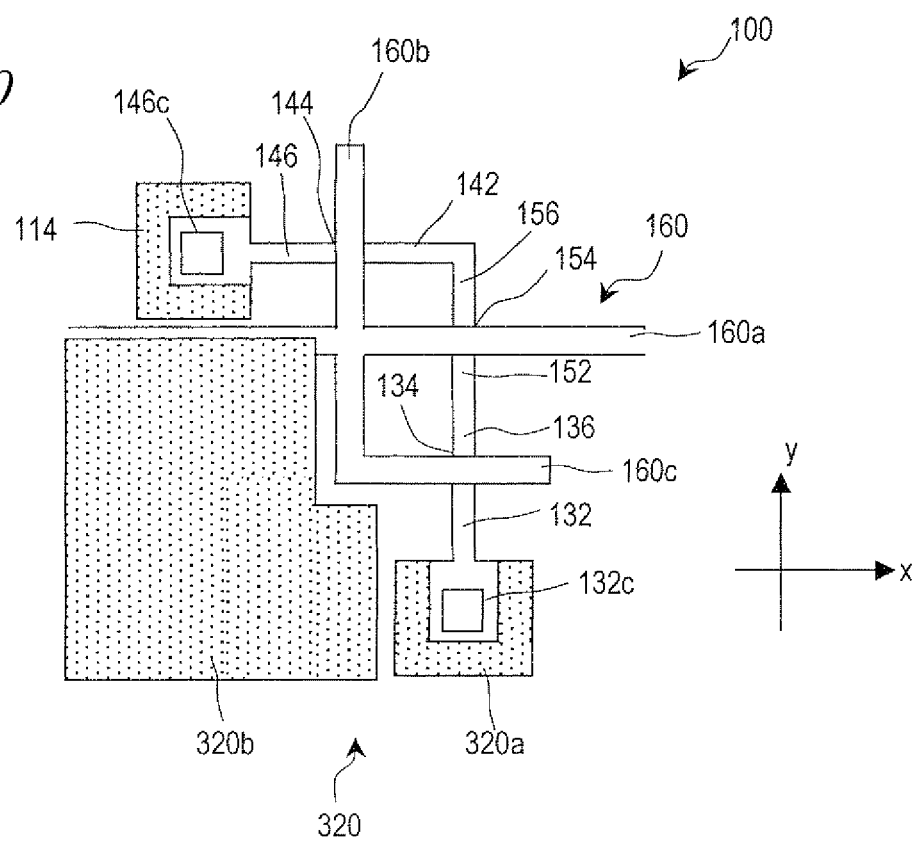
FIG. 10 is a schematic representation illustrating the shape and arrangement of another resist mask for use in the process step of introducing a gettering element in the manufacturing process of the active-matrix substrate according to the second preferred embodiment.

The active-matrix substrate 100 of this preferred embodiment may be fabricated by the similar manufacturing process as the one to make the active-matrix substrate of the first preferred embodiment that has already been described with reference to FIG. 4. That is why in the manufacturing process of this active-matrix substrate 100, when the gettering element is introduced, a resist mask 310 with an opening 310a and another opening 310b that is continuous with the opening 310a may be used as shown in FIG. 9. If the opening 310a over the gettering region 112 is continuous with the opening 310b over a region adjacent to the gettering region 112, however, leakage current could flow through the active-matrix substrate 100 as a final product between the gate bus line 160 and the source bus line 170 by way of the source electrode 172 as described above. To avoid such a situation, a resist mask 320, of which the opening 320a over the gettering region 112 and the opening 320b over its neighboring region are separate from each other, may be used as shown in FIG. 10. Then, the amount of leakage current to flow between the gate bus line 160 and the source bus line 170 by way of the source electrode 172 can be reduced.

Figure 11:
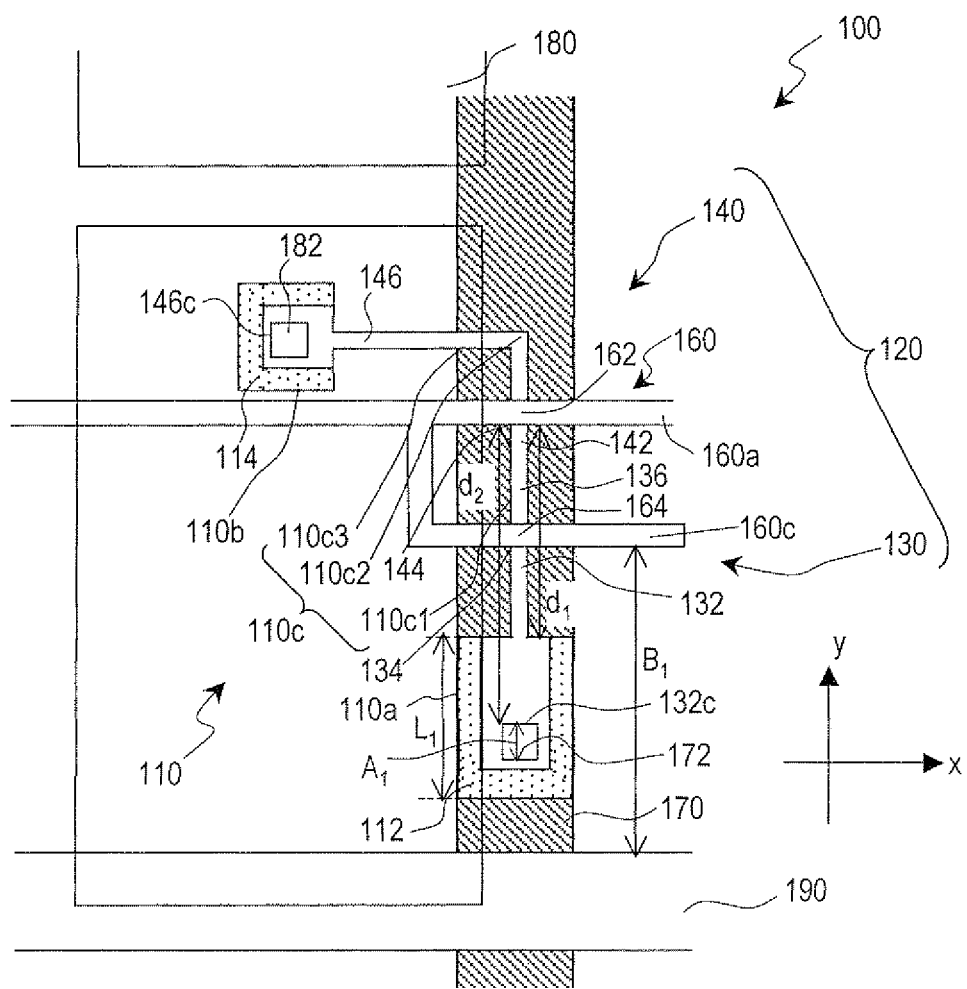
FIG. 11 is a schematic plan view illustrating a modified example of an active-matrix substrate according to the second preferred embodiment of the present invention.

In the active-matrix substrate 100 shown in FIG. 7, the gate bus line 160 includes the trunk portion 160a and the two branch portions 160b and 160c. However, the present invention is in no way limited to that specific preferred embodiment. Alternatively, the gate bus line 160 may also have only the trunk portion 160a and the branch portion 160c without the branch portion 160b as shown in FIG. 11.

Figure 12:
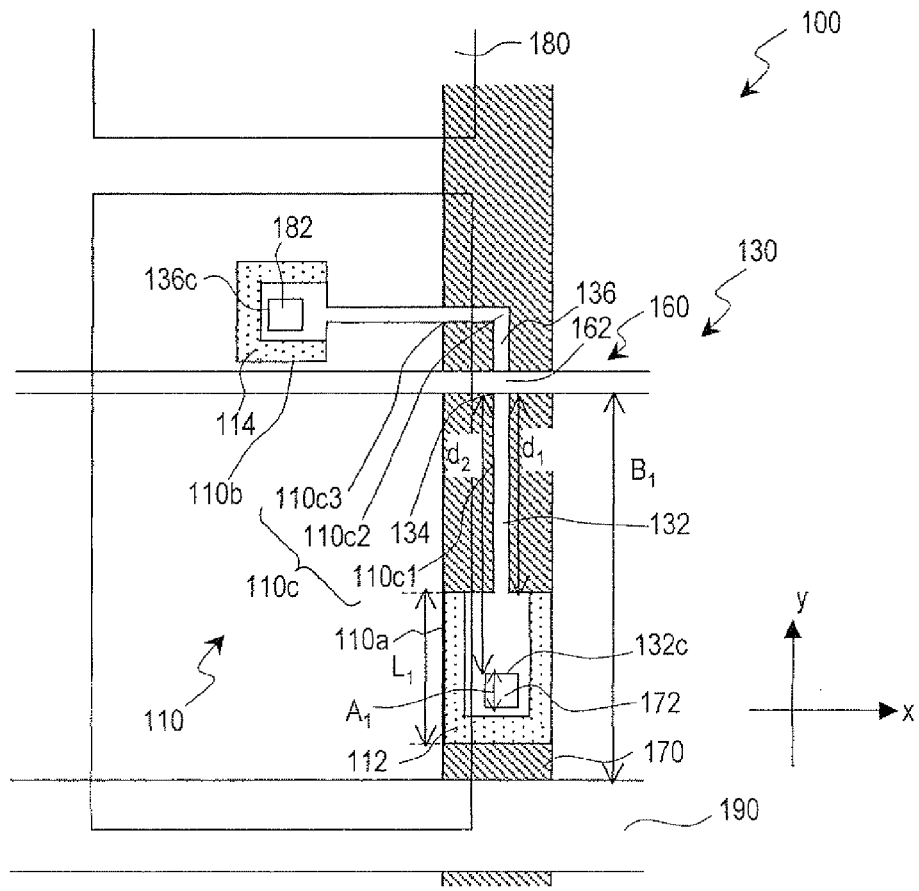
FIG. 12 is a schematic plan view illustrating another modified example of an active-matrix substrate according to the second preferred embodiment of the present invention.
Figure 13:
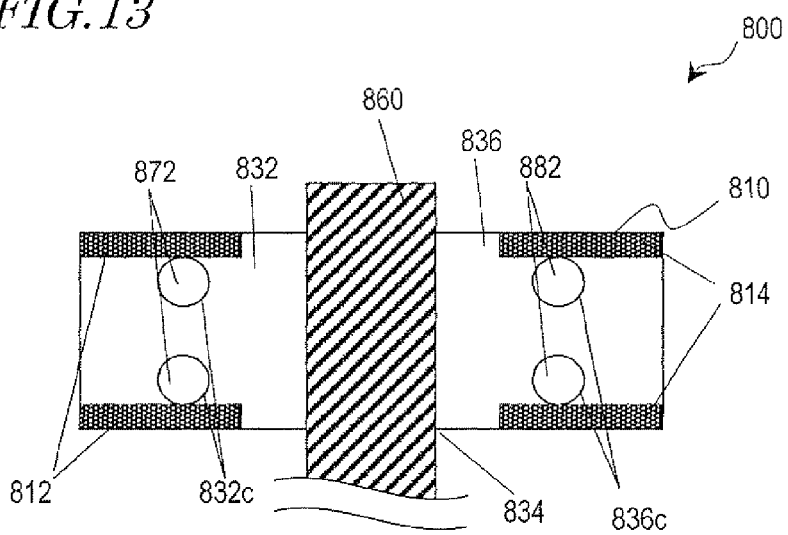
FIG. 13 is a schematic plan view illustrating a conventional semiconductor device.

Also, in the active-matrix substrate described above, the TFT element 120 includes multiple TFTs. However, the present invention is in no way limited to that specific preferred embodiment. As shown in FIG. 12, the TFT element 120 in the active-matrix substrate 100 could include only one TFT 130.

In the foregoing description, the display device that uses the active-matrix substrate is supposed to be a liquid crystal display device. However, the present invention is in no way limited to those specific preferred embodiments. Any other arbitrary display device such as a CRT, a plasma display panel (PDP), an organic EL, an SED or a liquid crystal projector, may also use the active-matrix substrate.

The entire disclosure of Japanese Patent Application No. 2007-69140, on which the present application claims priority, is hereby incorporated by reference.

INDUSTRIAL APPLICABILITY

An active-matrix substrate according to the present invention can be used effectively in PC monitors, TV sets, projectors, cellphone displays and various other display devices.

The invention claimed is:

1. An active-matrix substrate comprising:
a semiconductor layer;
a thin-film transistor element including a first thin-film transistor, which has a source region, a channel region and a drain region that are included in the semiconductor layer, wherein the channel region is defined by overlap with a gate;
a gate bus line;
a source bus line; and
a pixel electrode,
wherein the source region of the first thin-film transistor includes a source contact portion, and
wherein the semiconductor layer has a first gettering region adjacent to the source region of the first thin-film transistor, and
wherein the semiconductor layer has a first end portion, a second end portion and an intermediate portion between the first and second end portions, and
wherein the first end portion has a greater width than the intermediate portion, and
wherein a part of the source region of the first thin-film transistor, including the source contact portion, and the first gettering region are located in the first end portion, and
wherein the first gettering region is located in an outer periphery of the first end portion except an electrical charge path leading from the source contact portion to the channel region of the first thin-film transistor, and
wherein the active-matrix substrate satisfies $d_2 > d_1 \geq d_3$ and $d_2 + A_1/2 > d_3 + L_1/2$, where $d_1$ is the length of the shortest line segment that connects together the channel region of the first thin-film transistor and the first gettering region in a direction corresponding to that of a line in a direction of $d_2$ that extends at least between and connects together the channel region of the first thin-film transistor and the source contact portion, $d_2$ is the distance from the channel region of the first thin-film transistor to the source contact portion in the semiconductor layer, $d_3$ is the distance from the channel region of the first thin-film transistor to the first end portion of the semiconductor layer, wherein the direction of d2 is defined by the shortest distance between the channel region of the first thin-film transistor and the source contact portion, $L_1$ is the length of the first end portion along the line in the direction of d2 that connects together the channel region of the first thin-film transistor and the source contact portion, and $A_1$ is the length of the source contact portion along the line in the direction of d2 that connects together the channel region of the first thin-film transistor and the source contact portion.

2. The active matrix substrate of claim 1, wherein the substrate satisfies $d_2 - d_1 > L_1/6$.

3. The active matrix substrate of claim 1, wherein the substrate satisfies $L_1 > 1.5 \times A1$.

4. The active matrix substrate of claim 1, wherein $d_1$ and $d_2$ satisfy 3 µm ≤ $d_1$ ≤ 13 µm and 8 µm ≤ $d_2$ ≤ 30 µm, respectively.

5. The active matrix substrate of claim 1, wherein at least a part of the intermediate portion runs parallel to, and overlaps with, the source bus line.

6. The active matrix substrate of claim 1, wherein at least a part of the first end portion overlaps with the source bus line.

7. The active matrix substrate of claim 1, further comprising a storage capacitor line, wherein the substrate satisfies $B \geq 2d_2 + A_1$, where B is the distance between the gate bus line and the storage capacitor line.

8. The active matrix substrate of claim 1, wherein the thin-film transistor element further includes a second thin-film transistor, which also has a source region, a channel region and a drain region that are included in the semiconductor layer, and
wherein the first and second thin-film transistors are arranged in series with each other and the first thin-film transistor is located at one end, while the second thin-film transistor is located at the other end, and
wherein the drain region of the second thin-film transistor includes a drain contact portion.

9. The active matrix substrate of claim 8, wherein the semiconductor layer has a second gettering region adjacent to the drain region of the second thin-film transistor.

10. The active matrix substrate of claim 9, wherein the second end portion has a greater width than the intermediate portion, and
wherein a part of the drain region of the second thin-film transistor, including the drain contact portion, and the second gettering region are located in the second end portion, and
wherein the second gettering region is located in an outer periphery of the second end portion except an electrical charge path leading from the channel region of the second thin-film transistor to the drain contact portion, and wherein the active-matrix substrate satisfies $d_5 > d_4 \geq d_6$ and $d_5 + A_2/2 > d_6 + L_2/2$, where $d_4$ is the length of the shortest line segment that connects together the channel region of the second thin-film transistor and the second gettering region in a direction corresponding to that of a line in a direction of d5 that extends at least between and connects together the channel region of the second thin-film transistor and the drain contact portion, $d_5$ is the distance from the channel region of the second thin-film transistor to the drain contact portion in the semiconductor layer, wherein the direction of d5 is defined by the shortest distance between the channel region of the second thin-film transistor and the drain contact portion, $d_6$ is the distance from the channel region of the second thin-film transistor to the second end portion of the semiconductor layer, $L_2$ is the length of the second end portion along the line in the direction of d5 that connects together the channel region of the second thin-film transistor and the drain contact portion, and $A_2$ is the length of the drain contact portion along the line in the direction of d5 that connects together the channel region of the second thin-film transistor and the drain contact portion.

11. The active matrix substrate of claim 10, wherein $d_4$ and $d_5$ satisfy 3 μm ≤ $d_4$ ≤ 13 μm and 8 μm ≤ $d_5$ ≤ 30 μm, respectively.

12. The active matrix substrate of claim 8, wherein a part of the source region and the drain region of the first thin-film transistor, a part of the drain region and the source region of the second thin-film transistor, and the respective channel regions of the first and second thin-film transistors are located in the intermediate portion.

13. The active matrix substrate of claim 12, further comprising an adjacent source bus line next to the source bus line, wherein the substrate satisfies $d_5 < C - A_2$, where C is the distance between the gate bus line and the adjacent source bus line that are associated with the channel region of the second thin-film transistor.

14. The active matrix substrate of claim 1, wherein the drain region of the first thin-film transistor includes a drain contact portion, and
wherein the semiconductor layer has a second gettering region adjacent to the drain region of the first thin-film transistor.

15. The active matrix substrate of claim 14, wherein a part of the drain region of the first thin-film transistor, including the drain contact portion, and the second gettering region are located in the second end portion, and
wherein respective parts of the source and drain regions, and the channel region of the first thin-film transistor are located in the intermediate portion.

16. The active matrix substrate of claim 1, wherein the channel region includes a portion of the semiconductor layer under the gate bus line and a portion of the semiconductor layer under a gate electrode that branches off the gate bus line.

* * * * *